US010392548B2

(12) United States Patent
Maisonnave et al.

(10) Patent No.: US 10,392,548 B2
(45) Date of Patent: Aug. 27, 2019

(54) COMPOSITE MATERIAL PART HAVING A THERMALLY AND ELECTRICALLY CONDUCTIVE PORTION, AND A METHOD OF FABRICATING SUCH A PART

(71) Applicant: SAFRAN, Paris (FR)

(72) Inventors: Nicolas Maisonnave, Paris (FR); Marc-Antoine Colot, Fontainebleau (FR); Julien LeFrancois, Sainte Genevieve des Bois (FR)

(73) Assignee: SAFRAN, Paris (FR)

( * ) Notice: Subject to any disclaimer, the term of this patent is extended or adjusted under 35 U.S.C. 154(b) by 276 days.

(21) Appl. No.: 14/906,954

(22) PCT Filed: Jul. 21, 2014

(86) PCT No.: PCT/FR2014/051878
§ 371 (c)(1),
(2) Date: Jan. 22, 2016

(87) PCT Pub. No.: WO2015/011391
PCT Pub. Date: Jan. 29, 2015

(65) Prior Publication Data
US 2016/0168441 A1    Jun. 16, 2016

(30) Foreign Application Priority Data

Jul. 23, 2013    (FR) ...................................... 13 57239

(51) Int. Cl.
| C09K 5/14 | (2006.01) |
| B29C 70/54 | (2006.01) |
| B29C 70/88 | (2006.01) |
| B32B 5/02 | (2006.01) |

(Continued)

(52) U.S. Cl.
CPC .............. *C09K 5/14* (2013.01); *B29C 70/545* (2013.01); *B29C 70/885* (2013.01); *B32B 5/022* (2013.01);
(Continued)

(58) Field of Classification Search
CPC ........................................................ C09K 5/14
(Continued)

(56) References Cited

U.S. PATENT DOCUMENTS 4,455,207 A * 6/1984 Sartor ..................... C23C 14/20
204/192.14
5,255,738 A * 10/1993 Przilas ..................... B32B 5/08
165/185

(Continued)

FOREIGN PATENT DOCUMENTS

| EP | 2 602 097 A2 | 6/2013 |
| WO | WO 02/19346 A1 | 3/2002 |

OTHER PUBLICATIONS

International Search Report dated Nov. 13, 2014, in PCT/FR2014/051878 filed Jul. 21, 2014.

*Primary Examiner* — Jane L Stanley
(74) *Attorney, Agent, or Firm* — Oblon, McClelland, Maier & Neustadt, L.L.P.

(57) ABSTRACT

A composite material part including reinforcement made of carbon fibers or yarns consolidated by an organic matrix. The part includes one or more thermally and electrically conductive portions in which the carbon fibers or yarns are free of matrix at least in part, the matrix-free carbon fiber or yarn portions being in contact with a material that is thermally and electrically conductive.

12 Claims, 14 Drawing Sheets

(51) Int. Cl.
  *H01L 23/373*  (2006.01)
  *B32B 5/06*  (2006.01)
  *B32B 5/26*  (2006.01)

(52) U.S. Cl.
  CPC .............. *B32B 5/024* (2013.01); *B32B 5/06* (2013.01); *B32B 5/26* (2013.01); *H01L 23/3733* (2013.01); *H01L 23/3737* (2013.01); *B32B 2260/021* (2013.01); *B32B 2260/023* (2013.01); *B32B 2260/046* (2013.01); *B32B 2262/106* (2013.01); *B32B 2307/202* (2013.01); *B32B 2307/302* (2013.01); *B32B 2605/18* (2013.01); *H01L 2924/0002* (2013.01)

(58) Field of Classification Search
  USPC .......................................................... 252/73
  See application file for complete search history.

(56) References Cited

U.S. PATENT DOCUMENTS

| | | | |
|---|---|---|---|
| 6,284,089 B1* | 9/2001 | Anderson | B29C 65/5042 |
| | | | 156/304.3 |
| 6,311,769 B1* | 11/2001 | Bonneville | H01L 23/3677 |
| | | | 165/185 |
| 6,624,383 B1 | 9/2003 | Lichtenstein et al. | |
| 8,221,667 B2* | 7/2012 | Yao | H01L 23/373 |
| | | | 264/261 |
| 8,958,207 B2* | 2/2015 | Yamaguchi | H01L 23/373 |
| | | | 165/104.33 |
| 2009/0023299 A1* | 1/2009 | Yokonaga | H01L 21/76814 |
| | | | 438/769 |
| 2013/0149483 A1 | 6/2013 | Kruse et al. | |

\* cited by examiner

COMPOSITE MATERIAL PART HAVING A THERMALLY AND ELECTRICALLY CONDUCTIVE PORTION, AND A METHOD OF FABRICATING SUCH A PART

BACKGROUND OF THE INVENTION

The present invention relates to parts made of organic matrix composite material, and in particular parts for use in aircraft.

In the context of programs for developing airplanes that are ever more electrical, actuators that used to be pneumatic or hydraulic are being replaced by electric actuators that are controlled by means of electronic power modules. Nevertheless, it is necessary to provide high performance thermal management of such power modules in order to comply with the performance, weight, and volume criteria as defined for such systems.

Such thermal management requires optimized use of heatsinks present in the proximity of electronic power equipment, such as in particular streams of cold outside air in contact with surrounding walls.

The solutions presently available for cooling electronic power modules are heat exchangers (heat pipe, cold plate, etc.), fans, metal heat dissipators, etc.

The packages containing control modules are made of aluminum. Nevertheless, the technology used by those packages is no longer capable of dumping the heat generated by the power components or circuits since their density in a given volume has continued to increase over the last thirty years. In order to dump the ever-increasing amount of heat generated in such packages, it is necessary to increase the associated cooling devices, thereby increasing the bulk, the weight, and the mass of such electrical control systems.

Composite materials, and in particular composite materials made of carbon fiber reinforcement consolidated by an organic matrix, represent a good alternative to aluminum technology since they are lightweight, strong, and use carbon fibers, some varieties of which can be very good conductors of heat and electricity.

Nevertheless, and as explained in greater detail below, the resin used for forming the matrix acts as an insulator around the fibers, thereby preventing good thermal and electrical conductivity in the material, and that is harmful to dumping heat. There is thus a need to have available parts made of composite material comprising carbon fiber reinforcement densified by a resin matrix, but that nevertheless present good thermal and electrical conductivity.

OBJECT AND SUMMARY OF THE INVENTION

To this end, the invention proposes a composite material part comprising reinforcement made of carbon fibers or yarns consolidated by an organic matrix (i.e. a resin-based matrix), characterized in that it includes one or more thermally conductive portions in which the carbon fibers or yarns are free of matrix at least in part, and in that the matrix-free carbon fiber or yarn portions are in contact with a material that is thermally conductive.

Substituting the matrix with a thermally conductive material in one or more determined portions of the composite material of the part makes it possible to create heat bridges between the carbon fibers or yarns of the reinforcement and thus to improve the thermal conductivity of the part. The part thus presents improved heat exchange capabilities, making it possible in particular to optimize dissipation of the heat generated by the equipment or components in contact with the part. Improving thermal conductivity makes it possible to envisage new architectures or designs for applications that have until now been reserved to parts made of conductive material, such as metal. By means of the invention, these same parts can now be made out of composite material, i.e. achieving a significant saving in weight compared with parts made of metal materials.

In a first aspect of the part of the invention, it includes one or more thermally conductive portions in its surface. This serves to improve the surface thermal conductivity of the part, without significantly modifying the initial mechanical properties of the part.

In a second aspect of the part of the invention, it includes at least one recess, each recess including a thermally conductive portion, thus making it possible to create thermal bridges between the carbon fibers or yarns present at depth in the part, thus improving thermal conductivity in the part.

In a third aspect of the present invention, the thermally conductive material is also electrically conductive. Substituting the matrix with a material that is also electrically conductive in one or more determined portions of the composite material of the part makes it possible to create electrical contact between the carbon fibers or yarns of the reinforcement and thus to improve the electrical conductivity of the part.

In a particular application of the invention, the part constitutes a conductive wall made of organic matrix composite material. The part may also constitute a package for electronic power equipment. The part of the invention may advantageously be used for packaging power electronics since the improved thermal conductivity of the part of the invention makes it possible to achieve effective thermal management, e.g. when dissipating the heat generated by electrical actuator control modules.

The invention also provides an aircraft having at least one part corresponding in particular to a conductive wall or to a package as defined above.

The invention also provides a method of making one or more thermally conductive portions in a part made of composite material comprising reinforcement of carbon fibers or yarns consolidated by an organic matrix (i.e. a resin-based matrix), the method being characterized in that it comprises the following steps:

eliminating at least part of the matrix in one or more portions of the part so as to expose carbon fibers or yarns at least in part; and depositing a thermally conductive material on the exposed fiber or yarn portions.

In a first aspect of the method of the invention, the method further comprises a step of forming at least one recess in the part, the step of at least partially eliminating the organic matrix being performed in the recess, said recess being filled in during the step of depositing the thermally conductive material on the exposed fiber or yarn portions.

In a second aspect of the method of the invention, the reinforcement is made by weaving together a plurality of warp yarns and a plurality of weft yarns, and, while making the reinforcement, at least one portion of non-interlinking is formed that extends over a determined area and depth, the floating yarns present in each portion of non-interlinking being cut away after the reinforcement has been made so as to form a recess.

According to a third aspect of the method of the invention, the thermally conductive material is also electrically conductive.

BRIEF DESCRIPTION OF THE DRAWINGS

Other characteristics and advantages of the invention appear from the following description of particular embodiments of the invention given as non-limiting examples and with reference to the accompanying drawings, in which.

DETAILED DESCRIPTION OF IMPLEMENTATIONS

The invention applies in general manner to any part made of composite material comprising reinforcement made of carbon fibers or yarns and consolidated by an organic matrix, i.e. by a resin. The invention applies more particularly, but not exclusively, to parts for use in dissipating heat generated by heat sources, such as electronic power equipment, such as electrical actuator control modules for aircraft, where the part then advantageously constitutes a conductive wall or a package for power electronics.

The fabrication of such parts is well known and begins with making a fiber structure that may be of various forms, such as:
  two-dimensional (2D) fabric;
  three-dimensional (3D) fabric obtained by 3D weaving or as multiple layers;
  braiding;
  knitting;
  felt;
  a unidirectional (UD) sheet of yarns or tows or multidirectional sheets (nD) obtained by superposing a plurality of UD sheets in different directions and bonding the UD sheets together, e.g. by stitching or by needling.

It is also possible to use a fiber structure made up of a plurality of superposed layers of fabric, braiding, knitting, felt, sheets, etc., which layers are bonded together, e.g. by stitching, by implanting yarns or rigid elements, or by needling.

The yarns constituting the fiber structure are formed from continuous or discontinuous filaments of carbon fibers.

Possibly after shaping, the fiber structure is then consolidated. Consolidation of the fiber structure consists in filling in the pores of the structure, throughout all or part of its volume, with the material that constitutes the matrix.

The matrix of the composite material is obtained in conventional manner using a liquid technique. The liquid technique consists in impregnating the fiber structure with a liquid resin containing a precursor of the matrix material. The precursor is usually in the form of a polymer, possibly diluted in a solvent. The fiber structure is placed in a mold that can be closed in sealed manner and that has a recess with the shape of the final molded part. Thereafter, the mold is closed and the resin is injected throughout the recess in order to impregnate the fiber texture using the resin transfer molding (RTM) technique. Other known impregnation techniques may be used, such as passing the fiber texture through a continuous impregnator, or impregnation by infusion.

The composite material part may also be made by draping (stacking or superposing) plies of carbon fibers or yarns pre-impregnated with the matrix. The preform as constituted in this way is then processed in an autoclave in order to transform the resin into a solid matrix.

Other known techniques of preparing a composite material made of carbon fiber reinforcement consolidated by an organic matrix also form part of the present invention.

The matrix may be an organic matrix such as a thermoplastic or thermosetting resin. Transforming the precursor into a matrix, i.e. solidifying the resin, is performed by raising temperature when the resin is a thermosetting resin, or by lowering temperature when the resin is a thermoplastic resin, generally by heating and/or cooling the mold, after eliminating the solvent, if any, with the preform continuing to be held within the mold. Under such circumstances, a part is made out of organic matrix composite (OMC) material. The organic matrix may be obtained in particular using epoxy resin, such as high performance epoxy resin.

Figure 1:
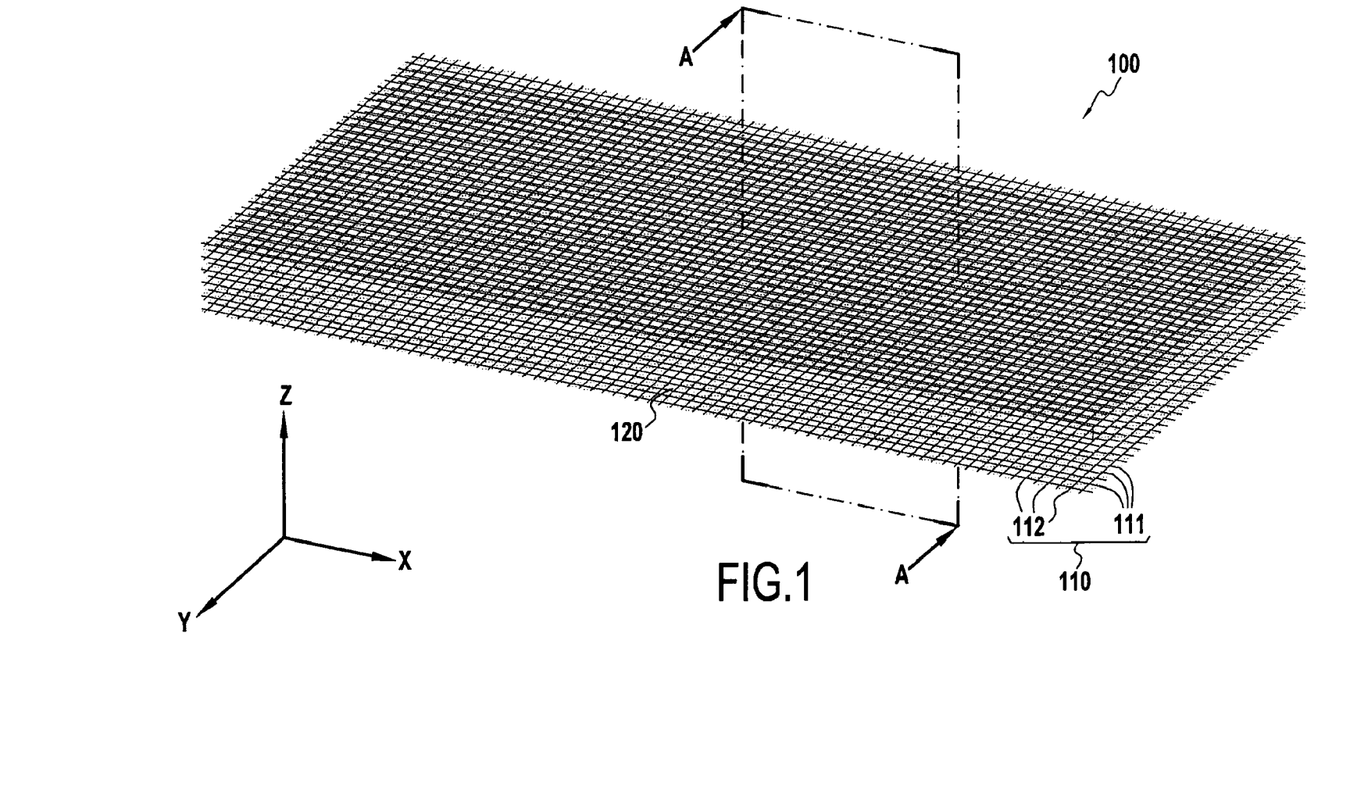
FIGS. 1, 1A, 2, 2A, 3, and 3A are diagrammatic views firstly in perspective and then in section showing how a portion having thermal and electrical conductivity is made in a part made of composite material in an implementation of the invention.

FIG. 1 shows a part 100 made in this example out of fiber reinforcement 110 obtained by 3D weaving with an interlock weave among a plurality of warp yarns 111 and a plurality of weft yarns 112, each yarn being made form carbon fibers. The term "interlock" is used herein of weaving to mean a weave in which each layer of warp (or weft) yarns interlinks a plurality of layers of weft (or warp) yarns, with all of the yarns in the same warp (or weft) columns having the same movement in the weave plane. The fiber reinforcement 100 in this example is consolidated with an organic matrix 120 obtained by RTM injection of an epoxy resin into the fiber reinforcement, which resin is then polymerized.

Figure 1A:
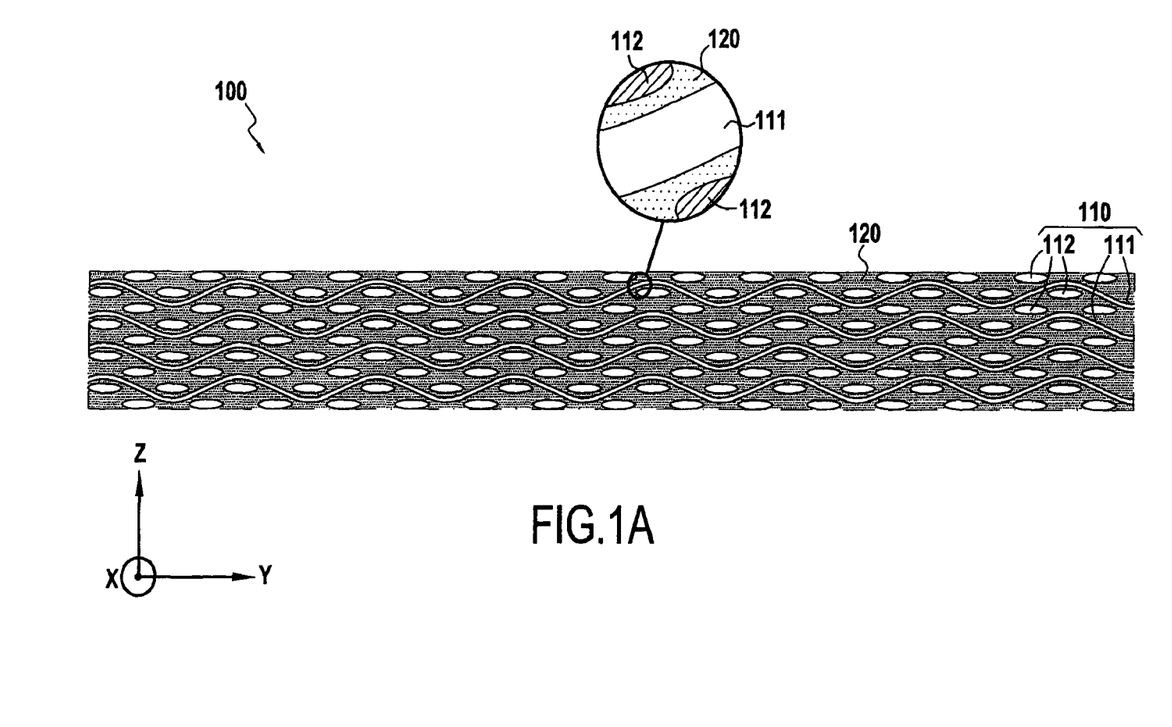

As can be seen in the enlarged detail view of FIG. 1A, the numerous pores in the fiber reinforcement 110 are filled with the matrix 120. The carbon yarns 111 and 112 are then coated by the resin matrix 120 and are no longer intimately in contact with one another, thereby greatly reducing thermal and electrical conductivity within the composite material of the part.

Figure 2:
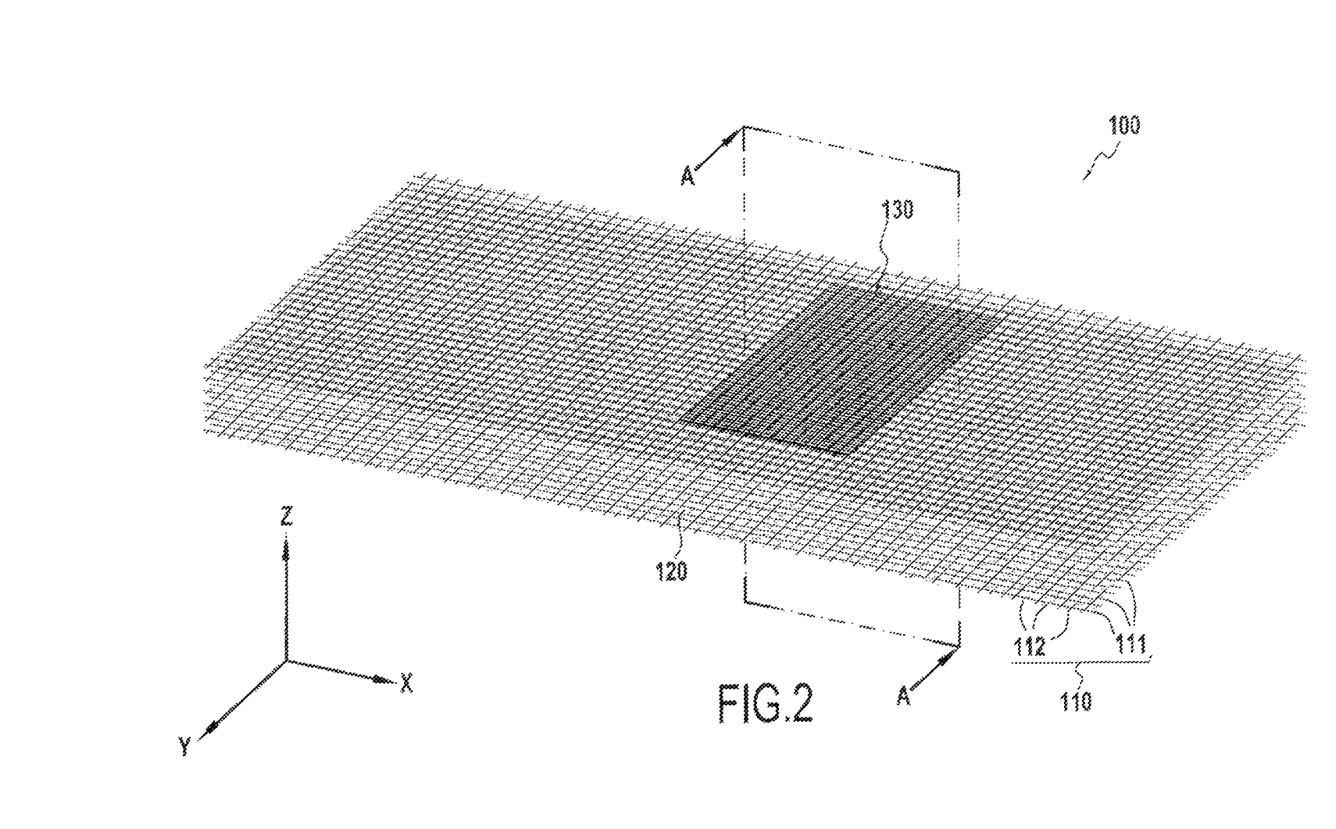
Figure 2A:
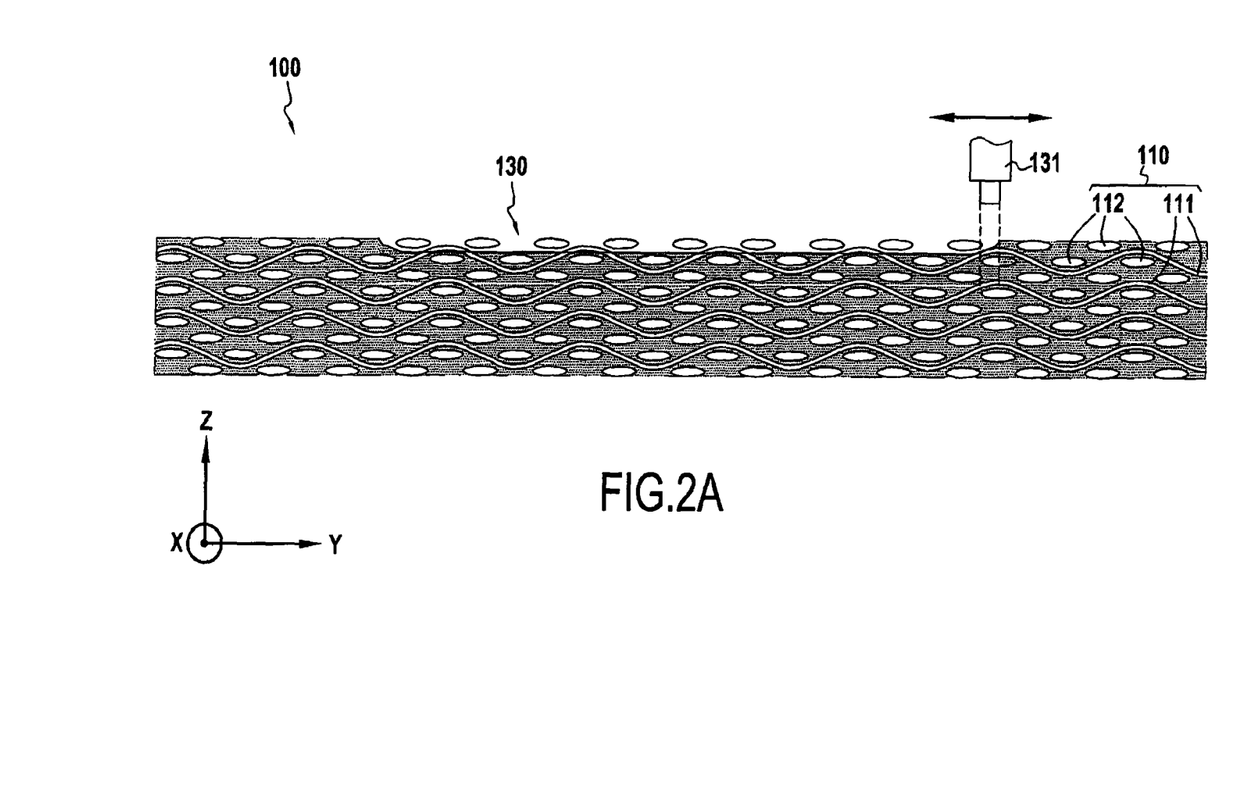

In accordance with the invention, and as shown in FIGS. 2 and 2A, the matrix is subjected to localized removal from the surface of the composite material of the part. In the presently-described example, the solid resin matrix is removed by a jet of water 131 under pressure over a determined portion 130 of the surface of the part 100. It is possible to use any other technique, such as shotblasting or sandblasting, for mechanically removing or abrading the matrix so as to expose the yarn for fibers present at the surface of the portion in question. The part is attacked over the entire area defined by the portion 130 using the jet 131 of water under pressure, thereby laying bare the warp yarns 111 and the weft yarns 112 present in the portion 130 over a determined depth starting from the top surface of the part 100.

Figure 3:
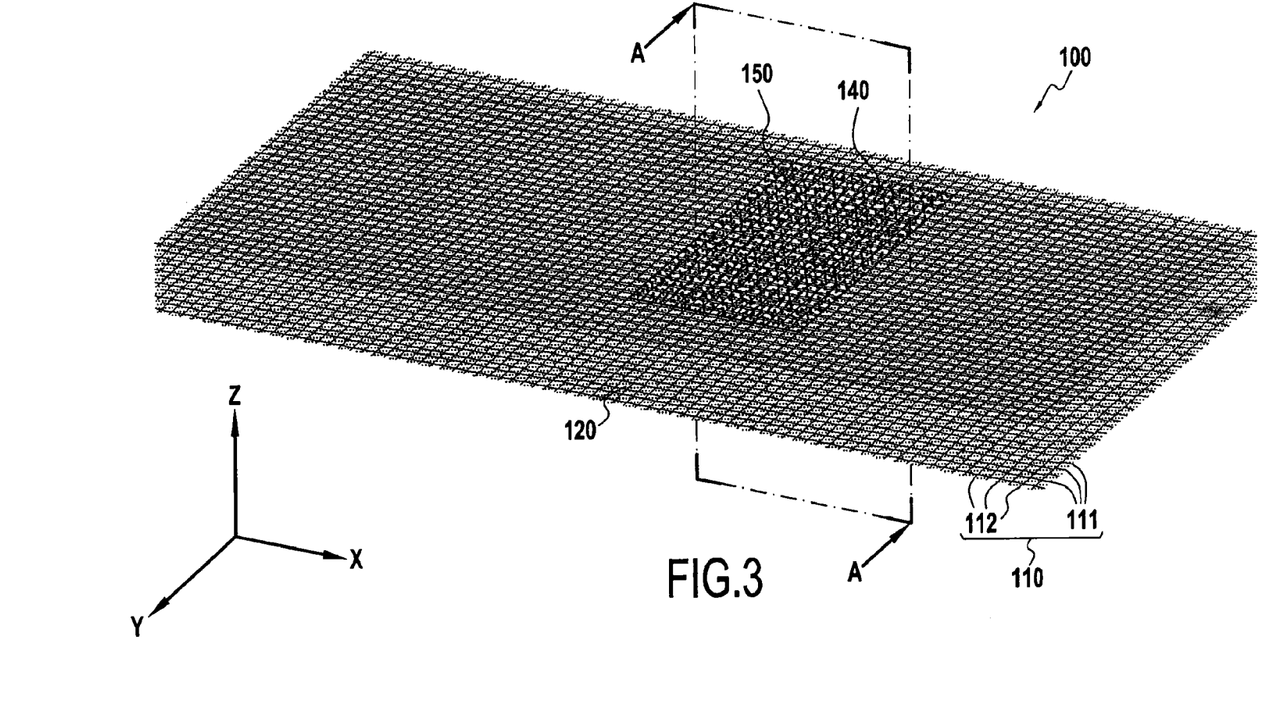
Figure 3A:
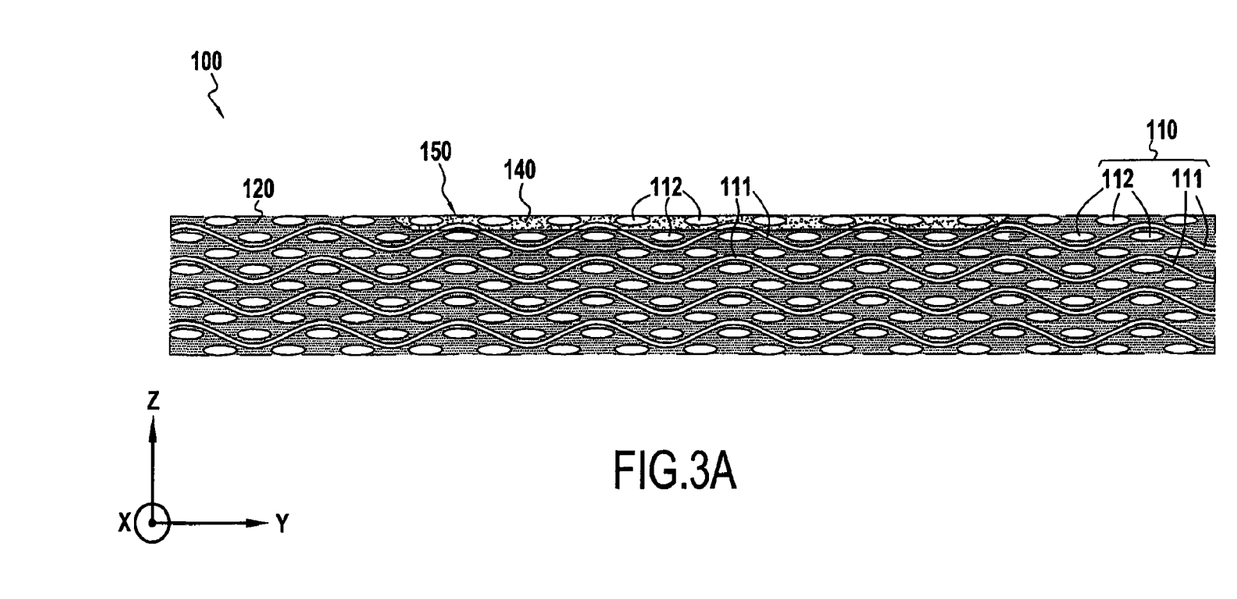

Still in accordance with the invention, a thermally conductive material 140 is then deposited in the pores that have been reopened by removing the matrix from the portion 130, as shown in FIGS. 3 and 3A. The material 140 is preferably also electrically conductive. The material 140 preferably presents thermal conductivity greater than or equal to 230 watts per meter-kelvin ($W \cdot m^{-1} \cdot K^{-1}$) and electrical conductivity greater than or equal to $3.78 \times 10^7$ siemens per meter ($S \cdot m^{-1}$). The thermally and electrical conductive material 140 may in particular be a metal material such as an alloy of aluminum that is deposited by plasma, by dipping in a metal-plating bath, by applying a conductive paint, etc. The technique used for depositing the layer of metallization is selected as a function of the thickness of the layer that is to be formed, which thickness generally lies in the range a few micrometers to a few millimeters. As shown in FIGS. 3 and 3A, a thermally and electrically conductive portion 150 is thus formed in the composite material of the part 100, with thermal bridges and zones of electrical contact being created in this portion between the warp yarns 111 and the weft yarns 112 by the matrix 120 being replaced locally by the thermally and electrically conductive material 140.

In the implementation described above with reference to the part 100, the thermally and electrically conductive portion is formed at the surface of the part. Nevertheless, the thermally and electrically conductive portion could equally well be formed to a greater depth in the composite material of the part, as explained below.

Figure 4:
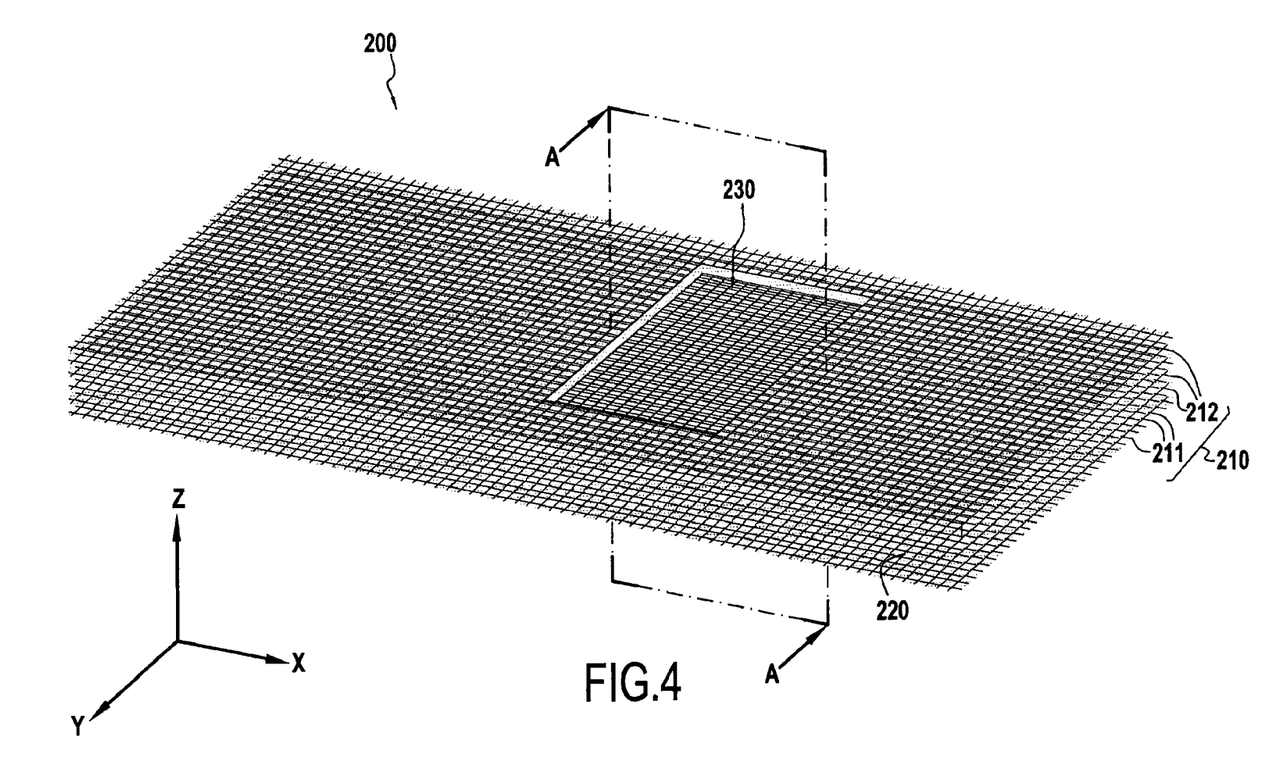
FIGS. 4, 4A, 5, and 5A, are diagrammatic views firstly in perspective and then in section showing how a portion having thermal and electrical conductivity is made in a part made of composite material in another implementation of the invention.

FIG. 4 shows a part 200 made in this example using fiber reinforcement 210 obtained by 3D weaving, e.g. using an interlock weave, between a plurality of warp yarns 211 and a plurality of weft yarns 212, each yarn being made of carbon fibers. The fiber reinforcement 200 in this example has been consolidated with an organic matrix 220 obtained by RTM injection of an epoxy resin into the fiber reinforcement, followed by polymerization of the injected resin.

Figure 4A:
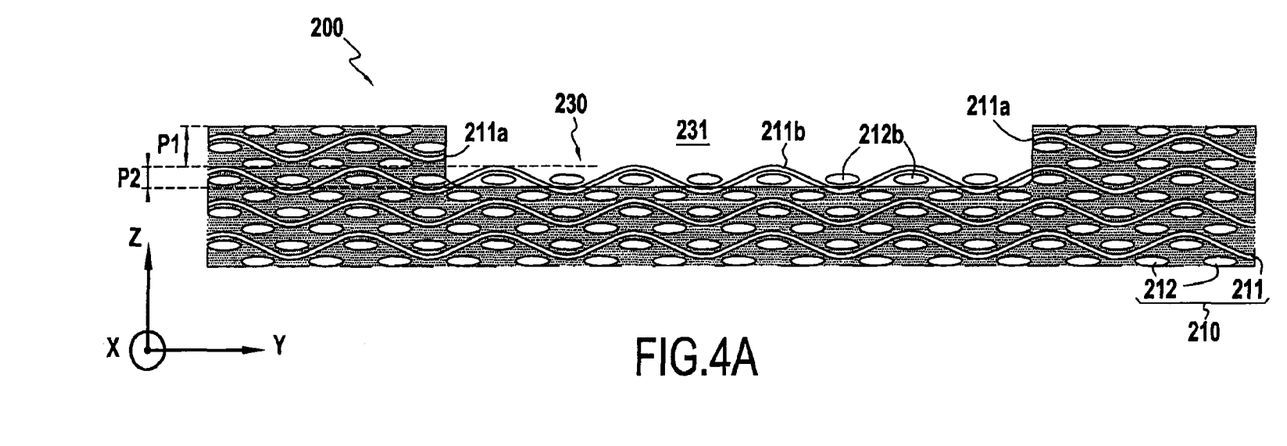

In accordance with the invention, and as shown in FIGS. 4 and 4A, the composite material of the part is subjected to mechanical attack over a determined portion using a force that is greater than that used for laying bare the surface yarns of the above-described part 100. For example, when using a water jet for the attack, its pressure is adjusted so as to attack the material of the part 200 to a greater depth than in the part 100. In this way, over a first depth P1 extending from the surface of the part 200, not only is the resin 220 attacked, but also the warp and weft yarns 211 and 212 so as to form a recess 231 in the portion 230. Over a depth P2 extending under the depth P1, only the resin 220 is attacked since the impact force of the water jet is smaller. The warp yarns 211b and weft yarns 212b present in this zone of depth P2 are then laid bare as shown in FIG. 4A. It is possible to use any other technique for mechanical removal or abrasion, such as shotblasting or sandblasting for example.

Still in accordance with the invention, the portion 230 is then filled in by depositing a thermally conductive material 240 both in the reopened pores among the yarns that have been laid bare in the depth P2 and in the uncovered zone over the depth P1 (recess 231). The material 240 is preferably also electrically conductive, and may in particular be one of the materials mentioned above.

Figure 5:
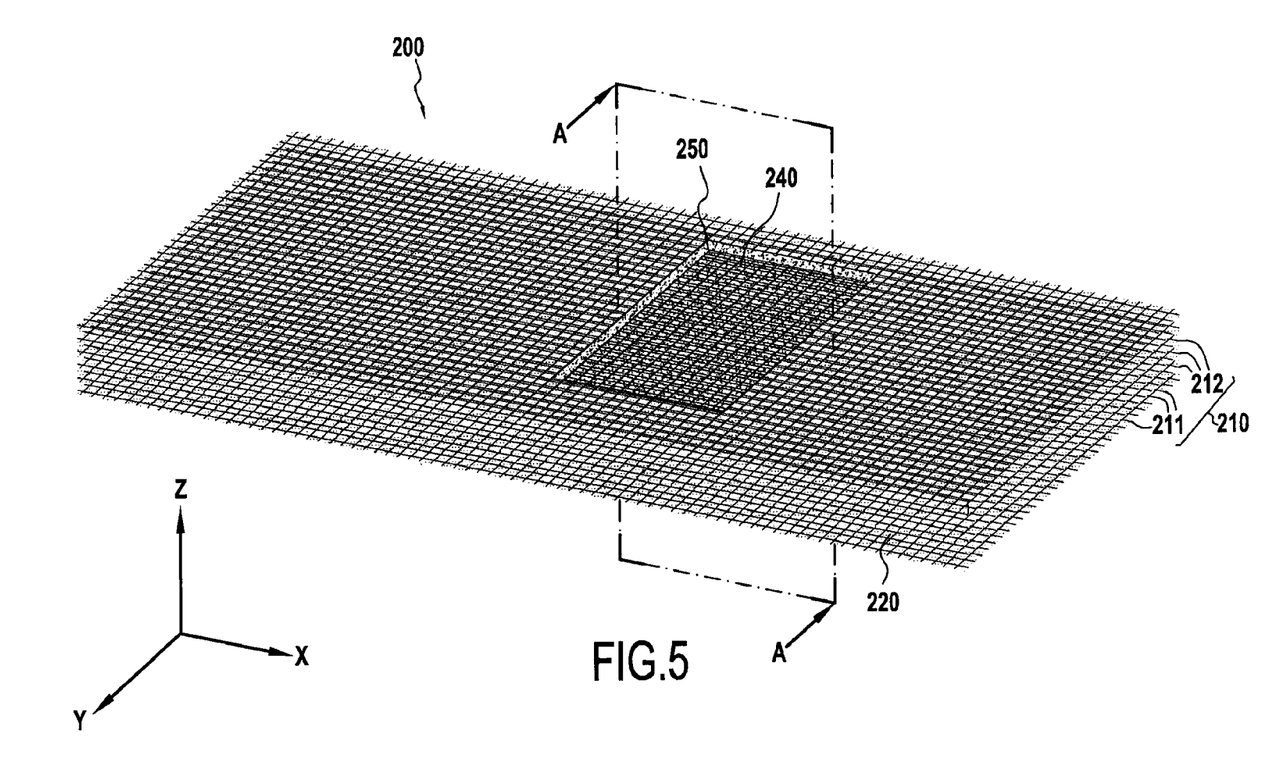
Figure 5A:
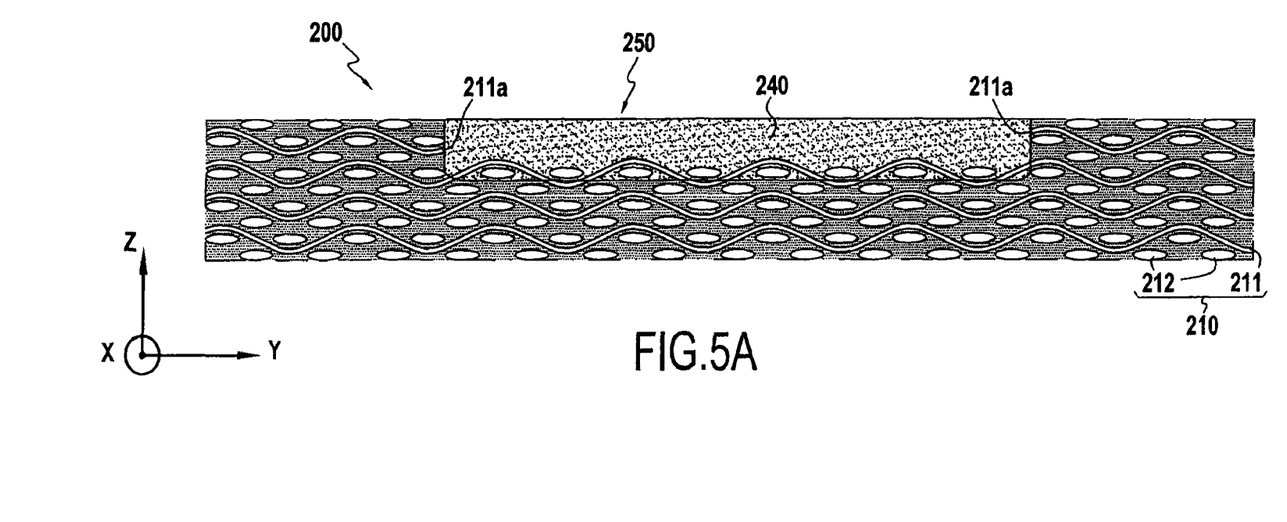

As shown in FIGS. 5 and 5A, a thermally and electrically conductive portion 250 is thus formed in the composite material of the part 200, which portion is located in the core of the composite material of the part, with thermal bridges and zones of electrical contact being created between the warp yarns 211b and the weft yarns 212b situated in the core of the part. In addition, since the thermally and electrically conductive material 240 is also deposited in the zone uncovered over the depth P1, thermal bridges and electrical contact zones are also created with the ends of the warp yarns 211a and the weft yarns (not referenced in the section of FIG. 5A) present at the sides of the portion 230 in this zone.

There follows a description of another implementation of the invention enabling a portion of thermal and electrical conductivity to be formed in the core of the composite material part.

Figure 6:
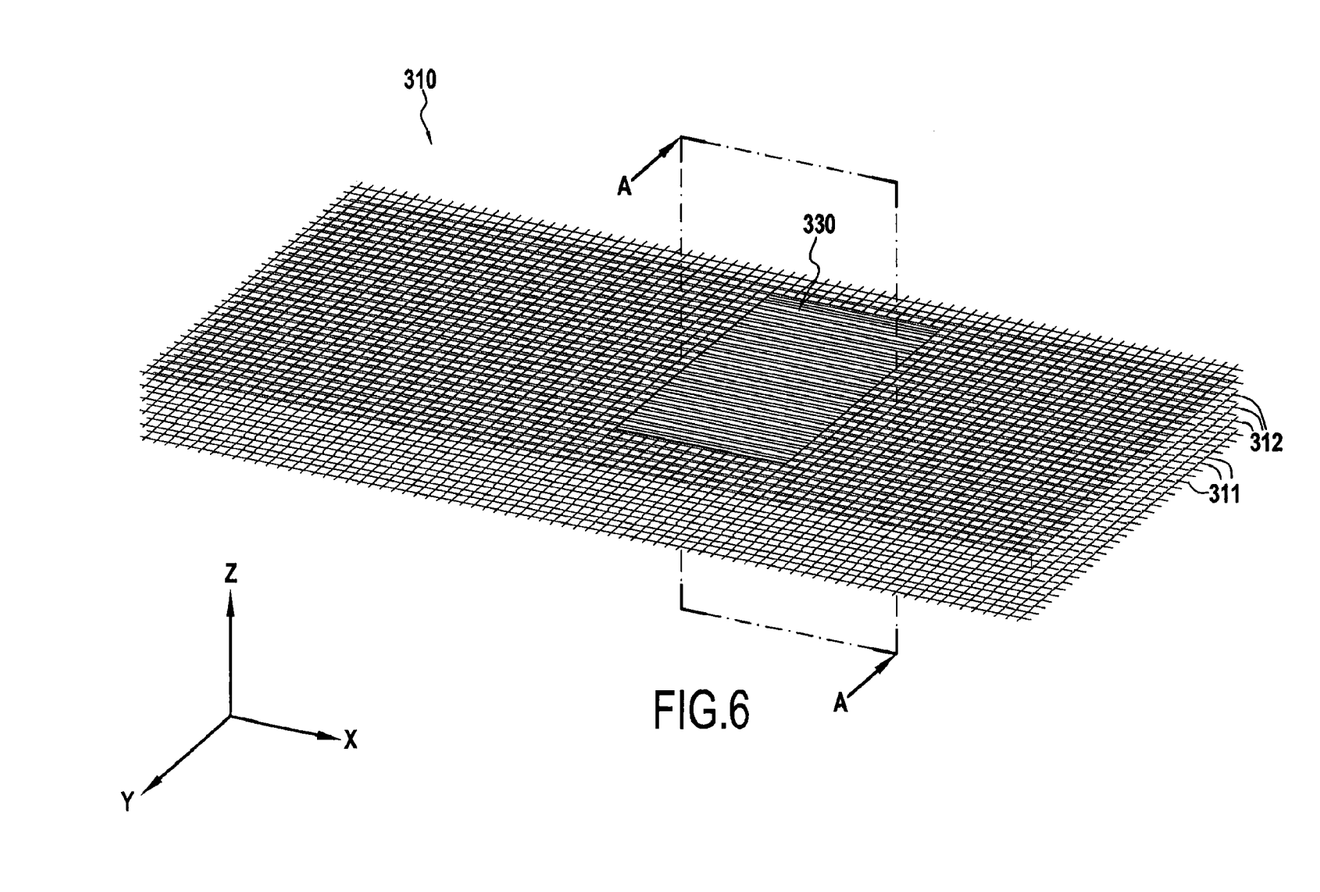
FIGS. 6 and 6A to 6E are respectively a perspective view and diagrammatic section views showing how a portion having thermal and electrical conductivity is made in a part made of composite material in yet another implementation of the invention.

FIG. 6 shows fiber reinforcement 310 obtained by 3D weaving, e.g. using an interlock weave, between a plurality of warp yarns 311 and a plurality of weft yarns 312, each yarn being made of carbon fibers.

Figure 6A:
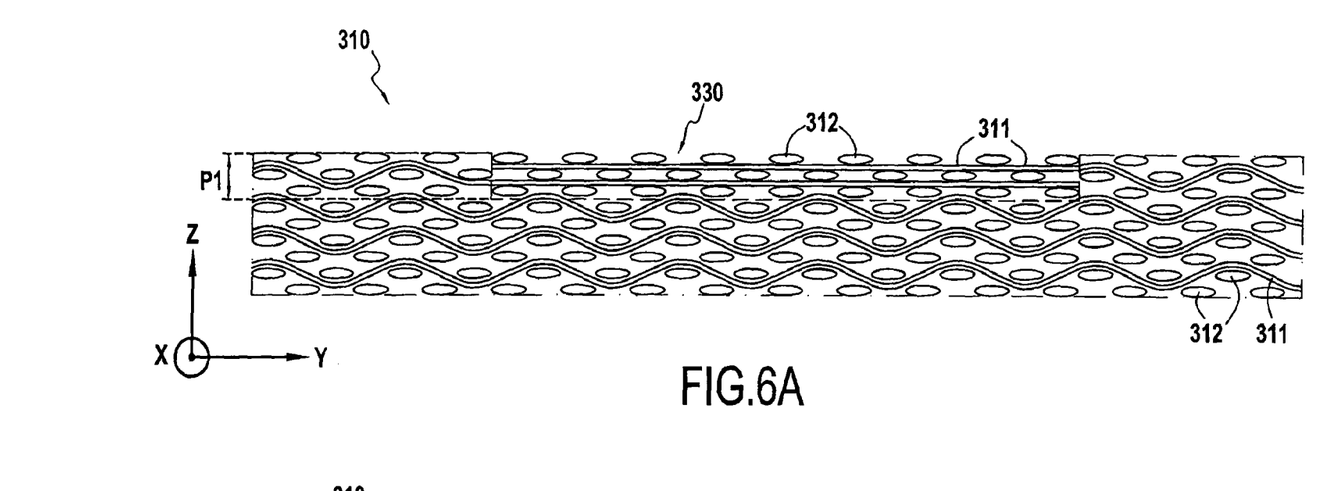

The fiber reinforcement 310 comprises a portion 330 corresponding to a zone of non-interlinking in the reinforcement, i.e. the warp yarns 311 present in the portion 330 over a first depth P1 are not woven with the weft yarns 312, as shown in FIG. 6A.

Figure 6B:
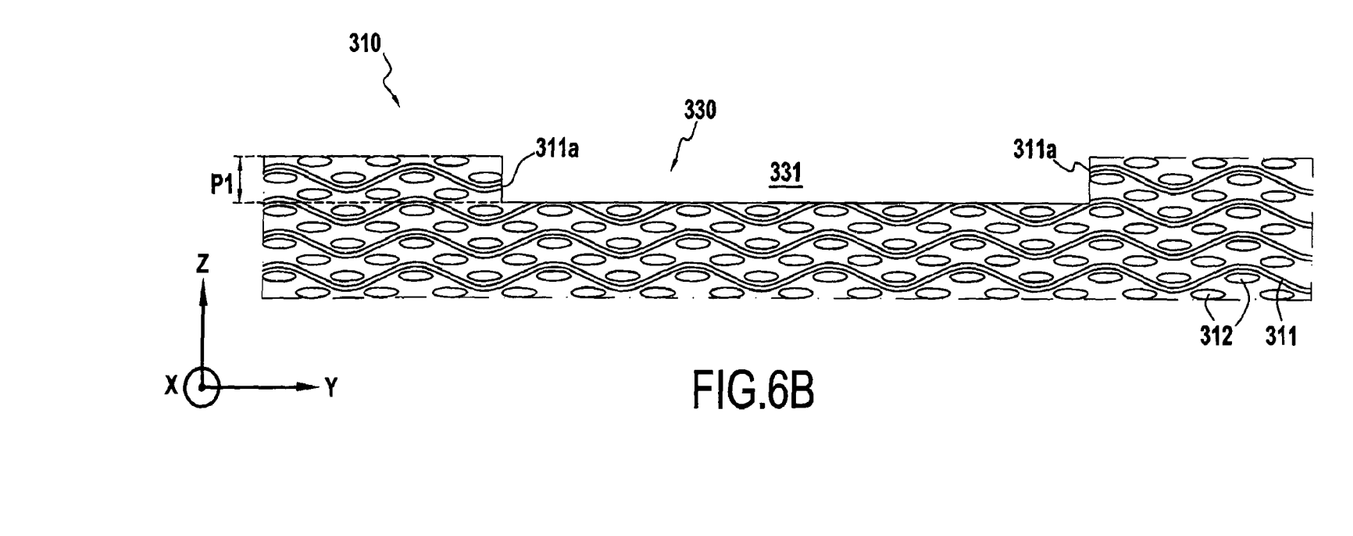

After the reinforcement 310 has been made, the non-woven warp yarns 311 are cut away, e.g. by laser or by water jet, so as to form a recess 331 in the reinforcement that extends over the first depth P1 (FIG. 6B).

Figure 6C:
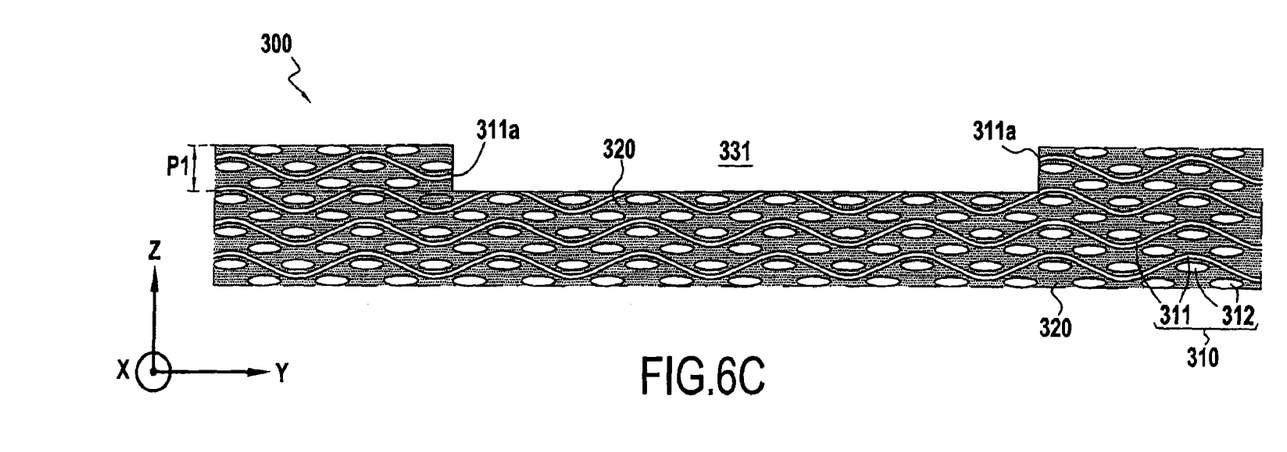

The fiber reinforcement 310 is then consolidated with an organic matrix 320 obtained by RTM injection of an epoxy resin into the fiber reinforcement, followed by polymerizing the injected resin so as to form a part 300 made of composite material (FIG. 6C).

Figure 6D:
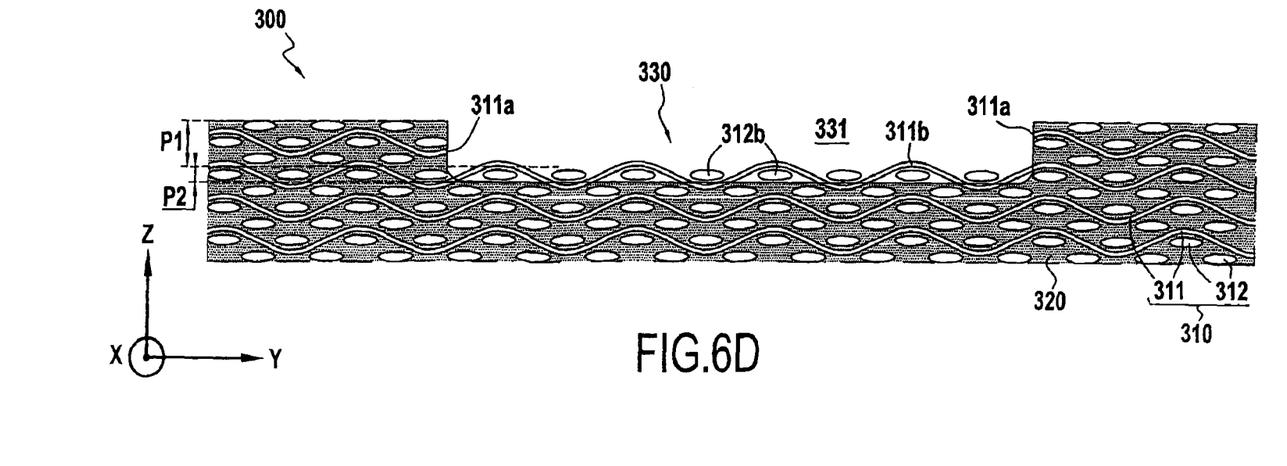

In accordance with the invention, and as shown in FIG. 6D, the matrix 320 present over a second determined depth P2 is then removed by mechanical attack so as to uncover the warp yarns 311b and weft yarns 312b present at the surface of the recess in the portion 330 (FIG. 6D). In the presently-described example, the solid resin matrix is removed with a shotblaster. It is also possible to use any other technique for mechanical removal or abrasion, such as a water jet under pressure or sandblasting, for example.

Figure 6E:
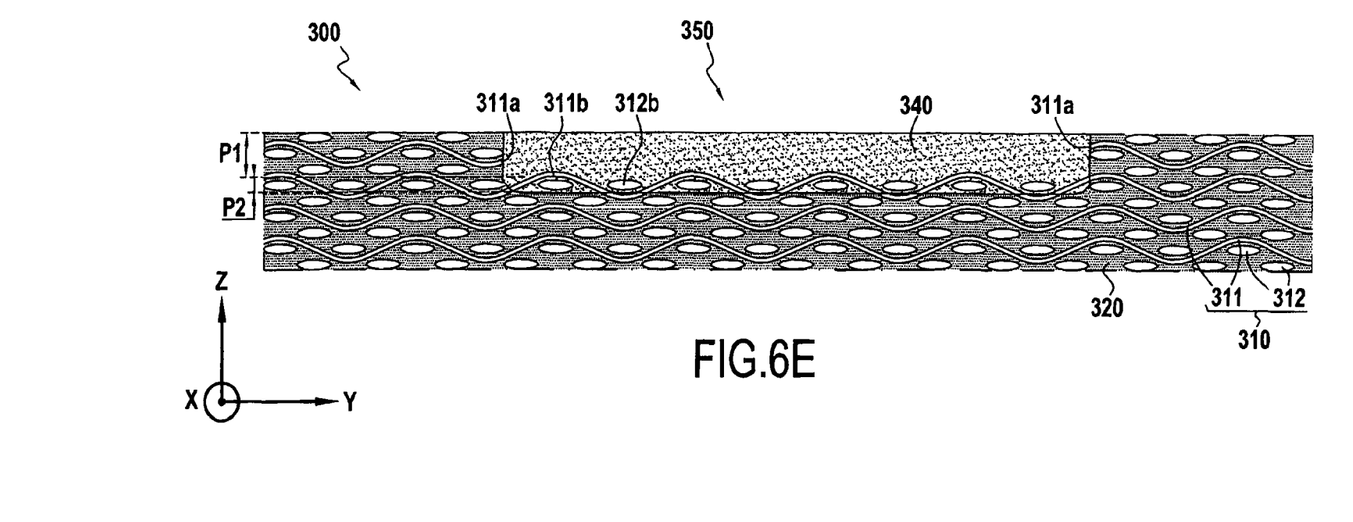

Still in accordance with the invention, the portion 330 is then filled in by depositing a thermally conductive material 340 both in the reopened pores between the yarns laid bare over the depth P2 and in the uncovered zone over the depth P1 (recess 331) (FIG. 6E). The material 340 is preferably also electrically conductive and it may in particular be one of the above-described materials.

As shown in FIG. 6E, this forms a portion 350 of thermal and electrical conductivity in the composite material of the part 300, which portion may be located in the core of the composite material of the part. Thermal bridges and electrical contact zones are thus created between the warp yarns 311b and the weft yarns 312b. In addition, since the thermally and electrically conductive material 340 is also deposited in the zone uncovered over the depth P1, thermal bridges and zones of electrical contact are also created at the ends of the warp yarns 311a and weft yarns (not referenced in the section of FIGS. 6B to 6E) present at the sides of the portion 330 in this zone.

The shape, the dimensions, and the distribution of the thermally and electrically conductive portions may be very varied. They are defined as a function firstly of the desired thermal and/or electrical conduction performance, and secondly as a function of the minimum mechanical properties that the composite material part needs to present.

Non-limiting examples of shapes and dimensions, and of distributions for the thermally and electrically conductive portions are described below, the part presenting recesses or zones of varying thickness that may be formed in particular by strongly attacking the composite material of the part or by forming zones of non-interlinking and cutting away the floating yarns while making the fiber reinforcement, as described above.

Figure 7A:
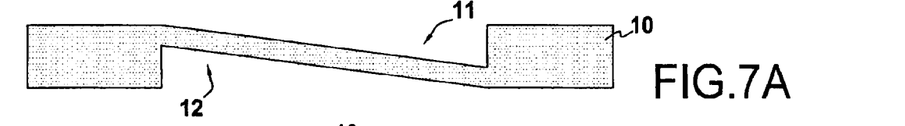
FIGS. 7A, 7B, 8A, 8B, 9A, 9B, 10A, and 10B are diagrammatic section views showing how various portions of thermal and electrical conductivity are made.
Figure 7B:
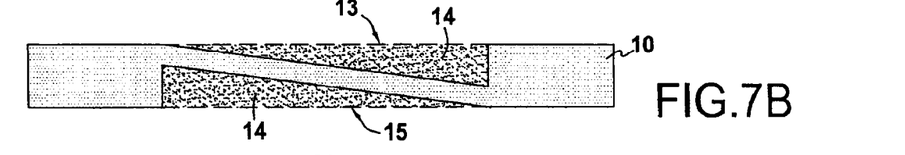

FIGS. 7A and 7B show a part 10 made of composite material comprising reinforcement made of carbon fibers densified with a resin matrix and including two recesses or zones 11 and 12 of varying thickness with a sloping profile made respectively in the top face and in the bottom face of the part, these recesses being filled in, after laying bare the yarns present at the surface of each recess, with a thermally and electrically conductive material 14 so as to form thermally and electrically conductive portions 13 and 15.

Figure 8A:
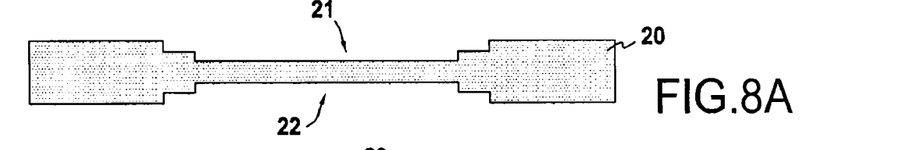
Figure 8B:
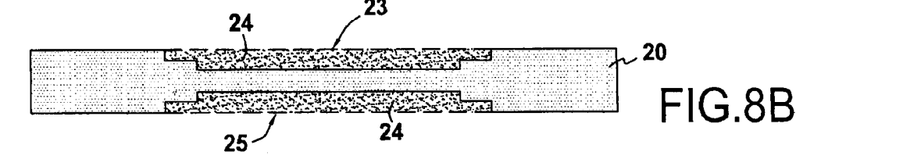

FIGS. 8A and 8B show a part 20 made of composite material comprising reinforcement made of carbon fibers densified with a resin matrix and including two recesses or zones 21 and 22 of varying thickness with a profile of staircase shape made respectively in the top face and in the bottom face of the part, these recesses being filled in, after laying bare the yarns present at the surface of each recess, with a thermally and electrically conductive material 24 so as to form thermally and electrically conductive portions 23 and 25.

Figure 9A:
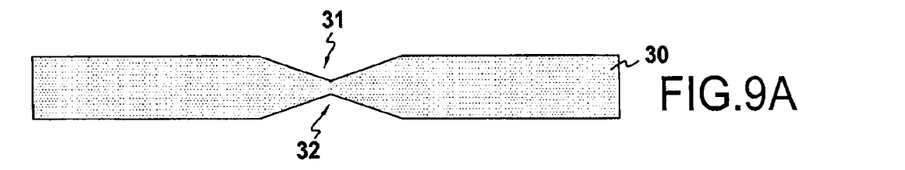
Figure 9B:
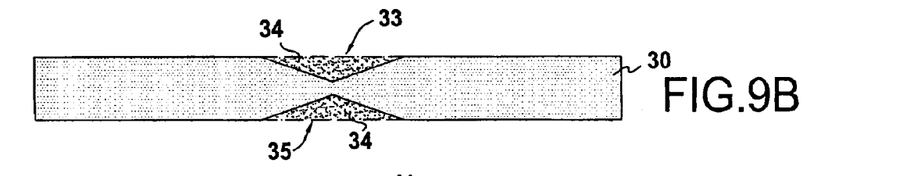

FIGS. 9A and 9B show a part 30 made of composite material comprising reinforcement made of carbon fibers densified with a resin matrix and including two recesses or zones 31 and 32 of varying thickness with a V-shaped profile made respectively in the top face and in the bottom face of the part, these recesses being filled in, after laying bare the yarns present at the surface of each recess, with a thermally and electrically conductive material 34 so as to form thermally and electrically conductive portions 33 and 35.

Figure 10A:
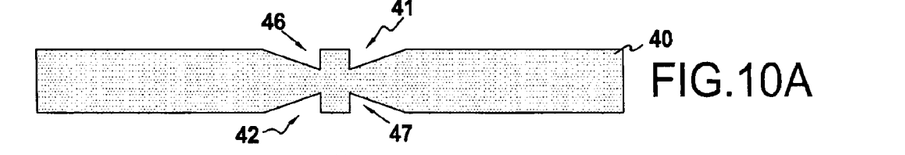
Figure 10B:
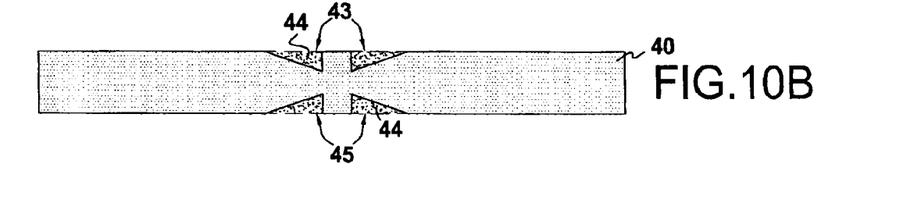

FIGS. 10A and 10B show a part 40 made of composite material comprising reinforcement made of carbon fibers densified with a resin matrix and including two recesses or zones 41 and 46 of varying thickness with a profile of triangular shape made in the top face 40 and two recesses of triangular profile 42 and 47 made in the bottom face of the part, these recesses being filled in, after laying bare the yarns present at the surface of each recess, with a thermally and electrically conductive material 44 so as to form thermally and electrically conductive portions 43 and 45.

With fiber reinforcement made by stacking 2D plies, the invention makes it possible to create thermal bridges and electrical contacts between the plies of the reinforcement. With fiber reinforcement obtained by 3D weaving, the invention makes it possible to create thermal bridges and electrical contacts between the reinforcing yarns in all three directions.

The part of the invention may include one or more thermally and electrically conductive portions. When the part has a plurality of such portions, they may be formed in alternation at the surface and in the core (in a recess) of the part so as to improve the conductivity of the part to different depths.

The part made of composite material having carbon fiber or yarn reinforcement consolidated by an organic matrix and including one or more portions of thermal conductivity in accordance with the present invention may advantageously be used for making one or more conductive walls made out of organic matrix composite (OMC) materials. The part of the invention may also constitute a package for containing power electronic circuits or components. Specifically, the presence of one or more of these portions serves to improve heat exchange between the inside and the outside of the package, thereby optimizing cooling of the power electronics.

The invention claimed is:

1. A composite material part comprising:
reinforcement made of carbon fibers or yarns consolidated by an organic matrix, the reinforcement comprising warp yarns or fibers and weft yarns or fibers woven together,
wherein said composite material part includes one or more thermally conductive portions in which the carbon fibers or yarns are free of matrix,
wherein the matrix-free carbon fiber or yarn portions are in contact with a material that is thermally conductive, and
wherein the material that is thermally conductive is situated in porosities between the carbon fibers or yarns free of matrix.

2. A part according to claim 1, comprising one or more thermally conductive portions in its surface.

3. A part according to claim 1, including at least one recess and wherein each recess includes a thermally conductive portion.

4. A part according to claim 1, wherein the thermally conductive material is also electrically conductive.

5. A conductive wall made of organic matrix composite material including the part according to claim 1.

6. An aircraft including the conductive wall according to claim 5.

7. A package for electronic power equipment including the part according to claim 1.

8. A part according to claim 1, wherein the material that is thermally conductive includes metal and presents a thermal conductivity greater than or equal to 230 watts per meter-kelvin.

9. A method of making one or more thermally conductive portions in a part made of composite material comprising reinforcement of carbon fibers or yarns consolidated by an organic matrix, the reinforcement comprising warp yarns or fibers and weft yarns or fibers woven together, the method comprising:
eliminating at least part of the organic matrix in one or more portions of the part so as to expose carbon fibers or yarns at least in part; and
depositing a thermally conductive material on the exposed fiber or yarn portions.

10. A method according to claim 9, further comprising forming at least one recess in the part, the eliminating at least part of the organic matrix being performed in the recess, said recess being filled in during the depositing the thermally conductive material on the exposed fiber or yarn portions.

11. A method according to claim 10, wherein, while making the reinforcement, at least one portion of non-interlinking is formed that extends over a determined area and depth, floating yarns present in each portion of non-interlinking being cut away after the reinforcement has been made so as to form a recess.

12. A method according to claim 11, wherein the thermally conductive material is also electrically conductive.

* * * * *